(12) United States Patent
Lee et al.

(10) Patent No.: US 7,173,758 B2
(45) Date of Patent: Feb. 6, 2007

(54) GAIN-CLAMPED SEMICONDUCTOR OPTICAL AMPLIFIER

(75) Inventors: Jeong-Seok Lee, Anyang-si (KR); Yun-Je Oh, Yongin-si (KR); Seong-Taek Hwang, Pyeongtaek-si (KR); Dong-Han Lee, Daejeon (KR); Jeong-Mee Oh, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 134 days.

(21) Appl. No.: 10/922,677

(22) Filed: Aug. 19, 2004

(65) Prior Publication Data

US 2005/0185263 A1   Aug. 25, 2005

(30) Foreign Application Priority Data

Feb. 25, 2004   (KR) .................. 10-2004-0012562

(51) Int. Cl.
*H01S 5/00* (2006.01)
*H01S 4/00* (2006.01)

(52) U.S. Cl. ..................................... 359/344; 398/175
(58) Field of Classification Search ................ 359/344; 398/175
See application file for complete search history.

(56) References Cited

U.S. PATENT DOCUMENTS 6,128,425 A * 10/2000 Dagens et al. ................ 385/14
6,563,631 B2 * 5/2003 Delprat et al. ............... 359/344
7,012,742 B2 * 3/2006 Lee et al. ..................... 359/334
2002/0067540 A1 * 6/2002 Delprat et al. ............... 359/344
2004/0228586 A1 * 11/2004 Kuhara ......................... 385/92
2005/0078359 A1 * 4/2005 Kim et al. ................... 359/344
2005/0105171 A1 * 5/2005 Shin et al. ................... 359/344
2005/0185262 A1 * 8/2005 Yun et al. .................... 359/344
2005/0226286 A1 * 10/2005 Liu et al. ....................... 372/25
2006/0050368 A1 * 3/2006 Chung et al. ................ 359/344

* cited by examiner

*Primary Examiner*—Jack Keith
*Assistant Examiner*—Eric Bolda
(74) *Attorney, Agent, or Firm*—Cha & Reiter, L.L.C.

(57) ABSTRACT

A gain-clamped semiconductor optical amplifier includes a semiconductor optical amplifier for amplifying an inputted optical signal and outputting amplified spontaneous emission light, the amplified spontaneous emission light consisting of a first portion and a second portion, the first portion having a wavelength range to be amplified. The amplifier further includes a wavelength selective reflector for allowing the first portion of the amplified spontaneous emission light to pass through the wavelength selective reflector and reflecting the second portion of the amplified spontaneous emission light again to the semiconductor optical amplifier, thereby clamping the gain of the amplifier.

21 Claims, 6 Drawing Sheets

GAIN-CLAMPED SEMICONDUCTOR OPTICAL AMPLIFIER

CLAIM OF PRIORITY

This application claims priority to that patent application entitled "Gain-Clamped Semiconductor Optical Amplifier," filed in the Korean Intellectual Property Office on Feb. 25, 2004 and assigned Serial No. 2004-12562, the contents of which are hereby incorporated by reference.

BACKGROUND OF THE INVENTION

1. Field of the Invention

The present invention relates to an optical amplifier, and more particularly to a gain-clamped semiconductor optical amplifier capable of preventing gain from changing during a period directly before gain saturation by means of a wavelength selective reflector.

2. Description of the Related Art

In an optical communication system, signal light sent from a transmitter suffers from transmission loss when transmitted through an optical transmission line, and arrives at a receiver with a reduced power. When the signal light received at the receiver has a power level less than a predetermined value, then communication may not be properly performed as the signal may have significant reception errors. Accordingly, an optical amplifier is installed between the transmitter and the receiver to amplify the signal light so that the transmission loss can be compensated and the signal light can be transmitted over a long distance with few errors.

Important characteristics in an operation of such an optical amplifier include gain, noise figure, and saturation output power. Erbium Doped Fiber Amplifiers, which have been extensively researched, have high gain, low noise figure, and large saturation output power, and have been widely used in optical networks, whether the networks are part of the communication backbone or are part of a metro network. However, Erbium Doped Fiber Amplifiers have disadvantages in that they are expensive have large sizes and a limited amplification bands.

In contrast, semiconductor optical amplifiers (SOAs) constitute semiconductor media in the form of waveguides and include an optical amplification function according to the gain property of the selected semiconductor. Semiconductor optical amplifiers have a lower cost, smaller size, and have amplification bands which can be relatively and freely adjusted.

However, semiconductor optical amplifiers have a high noise figure and a low intensity of a gain-saturated input signal. Therefore, when signals having high optical output are inputted to semiconductor optical amplifiers, the semiconductor optical amplifiers distort the signals and these distorted signals are transmitted.

In order to solve these problems, a gain-clamped semiconductor optical amplifier having a structure as shown in FIG. 1 has been proposed.

More specifically, FIG. 1 is a prospective view showing a conventional gain-clamped semiconductor optical amplifier 100. The gain-clamped semiconductor optical amplifier 100 includes an n-InP (Indium Phosphate) substrate 101, an InGaAsP (Indium Gallium Arsenic Phosphate) passive waveguide layer 102, an InP spacer 103, a distributed Bragg reflector (DBR) lattice pattern 104, an active layer waveguide 105, a current blocking layer 106, a p-InP clad layer 107, a passivation layer 108, a p-InGaAsP ohmic contact layer 109, an upper electrode 110, and a lower electrode 111.

The semiconductor optical amplifier 100 shown induces oscillation of a Bragg wavelength by means of DBR lattices 104 in both sides, thereby preventing electric charge density in a gain layer from increasing further.

However, in the conventional gain-clamped semiconductor optical amplifier (GC-SOA) shown, a step for forming the DBR lattice pattern is required, and, hence, the process for manufacturing the gain-clamped semiconductor optical amplifier is complicated. However, the wavelength of DBR mode moves toward a short wavelength by changing local refractive index profile due to the local carrier depletion near the gain saturation. The movement of the DBR mode changes the gain value of the amplifier by changing the carrier distribution and carrier density of the amplifier, which induces the gain fluctuation near the saturation region in the gain curve of the typical GC-SOA. Therefore, gain in the intensity of the inputted light changes during a period directly before input saturation. This is more clearly shown in FIG. 2, which plots the gain as a function of the power output.

SUMMARY OF THE INVENTION

An object of the present invention is to provide a gain-clamped semiconductor optical amplifier with improved linearity and intensity of gain-saturated input light by preventing a gain change occurring during a period directly before the gain saturation.

Another object of the present invention is to provide a gain-clamped semiconductor optical amplifier with no DBR lattice pattern.

In order to accomplish the aforementioned objects, according to one aspect of the present, there is provided a gain-clamped semiconductor optical amplifier comprising a semiconductor optical amplifier for amplifying an inputted optical signal and outputting amplified spontaneous emission light, the amplified spontaneous emission light consisting of a first portion and a second portion, the first portion having a wavelength range to be amplified and a wavelength selective reflector for allowing the first portion of the amplified spontaneous emission light to pass through and reflecting and inputting the second portion of the amplified spontaneous emission light to the semiconductor optical amplifier, thereby clamping the gain of the semiconductor optical amplifier.

In one preferred embodiment, a clamped gain value of a gain-clamped semiconductor optical amplifier is adjusted by adjusting a reflection factor of a wavelength selective reflector.

In a second preferred embodiment, the semiconductor optical amplifier includes a semiconductor substrate, an optical waveguide including a lower cladding, an active layer, and an upper cladding sequentially laminated on the semiconductor substrate, window regions, each of which is formed between one end of the optical waveguide and a cleavage surface opposed to the one end of the optical waveguide, and anti-reflection layers, each of which is formed on a cleavage surface opposed to the one end of the optical waveguide.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE INVENTION

Hereinafter, embodiments according to the present invention will be described with reference to the accompanying drawings. For the purposes of clarity and simplicity, a detailed description of known functions and configurations incorporated herein will be omitted as it may make the subject matter of the present invention unclear.

Figure 3A:
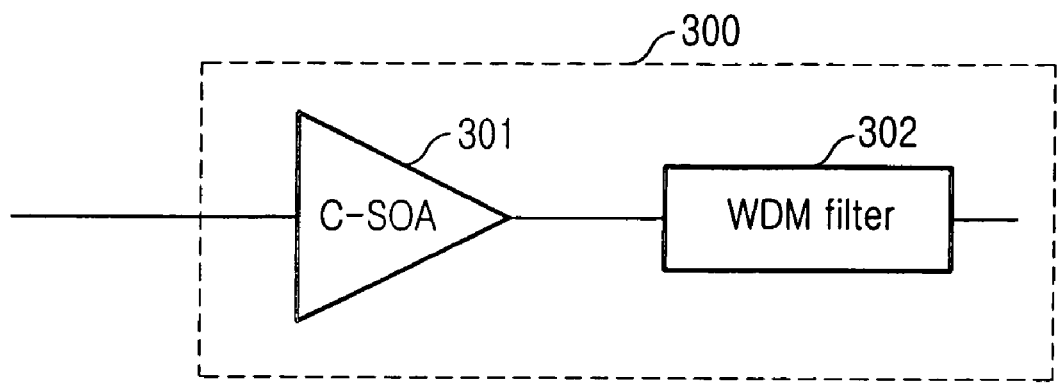
FIG. 3a is a view showing a construction of a gain-clamped semiconductor optical amplifier according to one embodiment of the present invention.

FIG. 3a is a view showing a construction of a gain-clamped semiconductor optical amplifier 300 according to one embodiment of the present invention. In this embodiment, gain-clamped semiconductor optical amplifier 300 includes a semiconductor optical amplifier 301 and a wavelength selective reflector 302 that is positioned subsequent to SOA 301.

The semiconductor optical amplifier 301 is a general semiconductor optical amplifier that does not include a Bragg lattice. SOA 301 amplifies an input optical signal and outputs amplified spontaneous emission light, as is known in the art. The amplified spontaneous emission light consists of a first portion and a second portion, and the first portion has a wavelength range to be amplified.

The wavelength selective reflector 302 allows the first portion of the amplified spontaneous emission light to pass through and reflects the second portion of the amplified spontaneous emission light. In one aspect of the invention, reflector 302 employs a reflector that allows a wavelength in the band around 1550 nm to pass through. Further, wavelength selective reflector 302 may be a separate reflector, or may be integrated with SOA 301 by laminating wavelength selective reflection layer onto the semiconductor optical amplifier 301 or parts of a module.

Figure 3B:
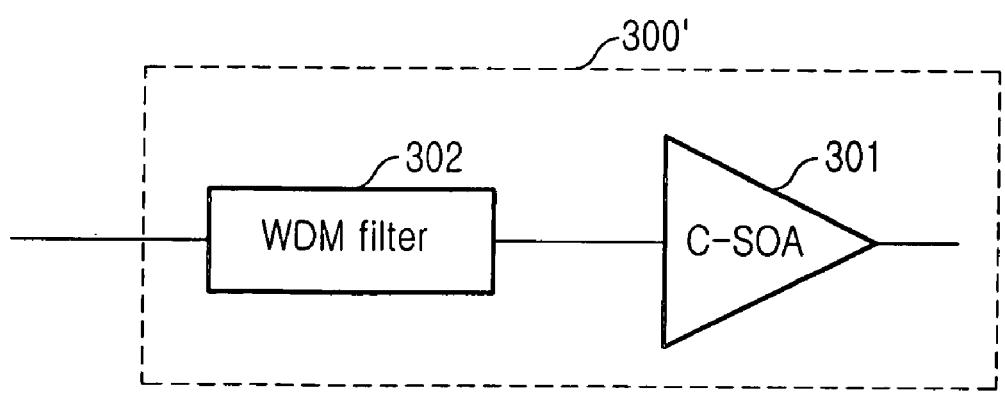
FIG. 3b is a view showing a construction of a gain-clamped semiconductor optical amplifier according to another embodiment of the present invention.

FIG. 3b is a view showing a construction of a gain-clamped semiconductor optical amplifier 300' according to another embodiment of the present invention. In this embodiment, gain-clamped semiconductor optical amplifier 300' includes a semiconductor optical amplifier 301 and a wavelength selective reflector 302 that is positioned prior to SOA 301. The operation is similar to that of the device shown in FIG. 3a and need not be described in detail again.

An operation of the gain-clamped semiconductor optical amplifier 300 or 300' shown in FIG. 3a and FIG. 3b will now be described.

Figure 4:
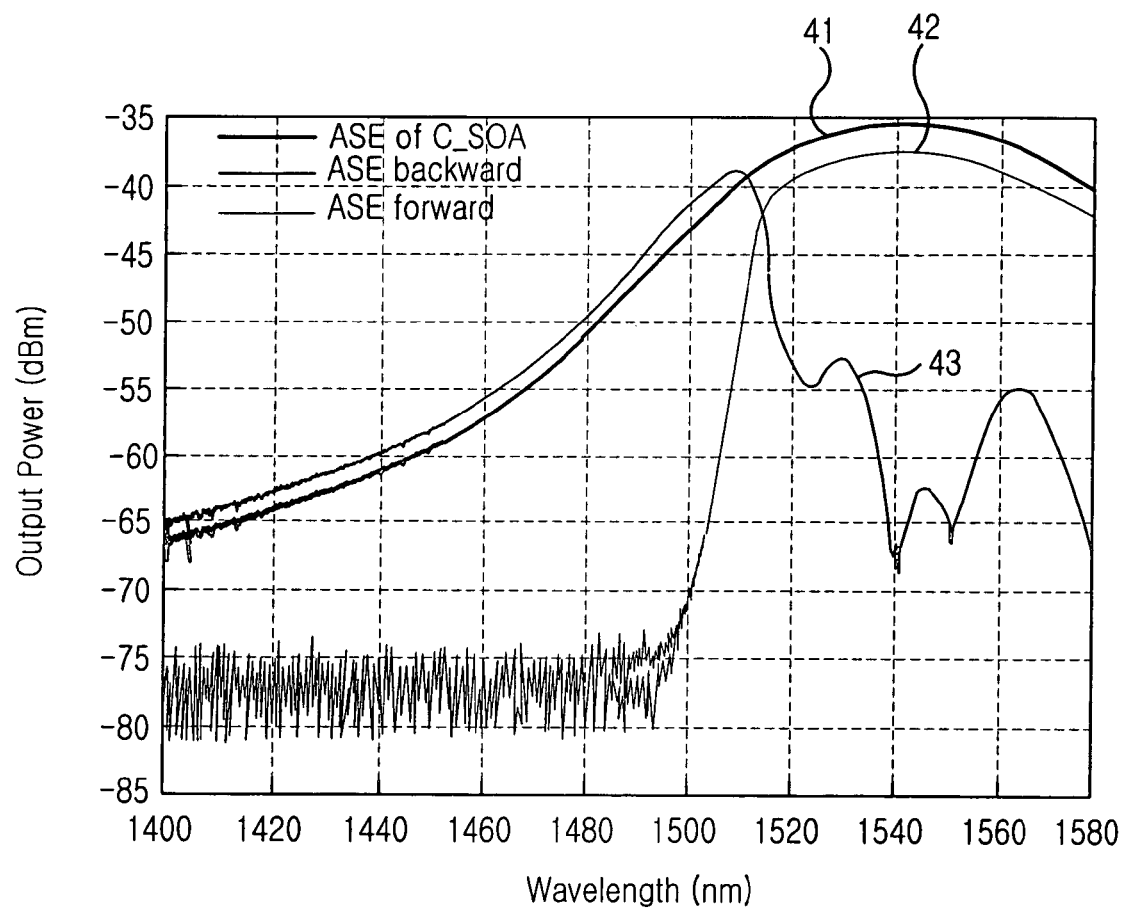
FIG. 4 is a graph showing an output spectrum of a gain-clamped semiconductor optical amplifier according to the present invention.

FIG. 4 is a graph showing the output spectrum of a gain-clamped semiconductor optical amplifier according to the present invention. Referring to FIG. 4, reference numeral 41 represents the spectrum of amplified spontaneous emission light amplified by the semiconductor optical amplifier 301, reference numeral 42 represents spectrum of amplified spontaneous emission light amplified in the forward direction by the wavelength selective reflector 302, i.e., FIG. 3a, and reference numeral 43 represents spectrum of amplified spontaneous emission light amplified in the reverse direction by the wavelength selective reflector 302, i.e., FIG. 3b.

In this illustrated case, the amplified spontaneous emission light 41 generated by the semiconductor optical amplifier 301 has a central wavelength of 1540 nm. In the case of the amplified spontaneous emission light 42 amplified in the forward direction by the wavelength selective reflector 302, the wavelength selective reflector 302 allows only a portion of the amplified spontaneous emission light with a wavelength longer than 1520 nm to pass through. The amplifier could be available at longer wavelength than 1520 nm. In contrast, in the case of the amplified spontaneous emission light 43 amplified in the reverse direction by the wavelength selective reflector 302, the wavelength selective reflector 302 reflects a portion of the amplified spontaneous emission light with a wavelength shorter than 1520 nm. As shown, the spectrum of the device shown in FIG. 3a is substantially reduced for wavelengths below 1520 nm and substantially follows the spectrum of amplified spontaneous emission for wavelengths above 1520 nm. Similarly, the spectrum of the device shown in FIG. 3b substantially matches the spectrum of amplified spontaneous emission for wavelengths below 1520 nm and is substantially reduced for wavelengths above 1520 nm.

Further, the amplified spontaneous emission light 43 progressing in the reverse direction passes through the semiconductor optical amplifier 301 again and is amplified by the semiconductor optical amplifier 301. Herein, when a wavelength selective reflector is used, there is no change such as an additional increase in gain ripple.

As described above, a gain-clamped semiconductor optical amplifier according to the present invention does not employ a complicated structure in which external laser light is purposefully inputted to the gain-clamped semiconductor optical amplifier, or a predetermined wavelength oscillates in a device, for gain clamping. Instead, the gain-clamped semiconductor optical amplifier allows the spectrum of a short wavelength range of amplified spontaneous emission light, which has been amplified by a semiconductor optical amplifier, to be reflected so as to be inputted to the semiconductor optical amplifier again. In addition, in order to clamp gain, the gain-clamped semiconductor optical amplifier does not use the wavelength of a single mode, but uses light over a wide spectrum band.

Figure 1:
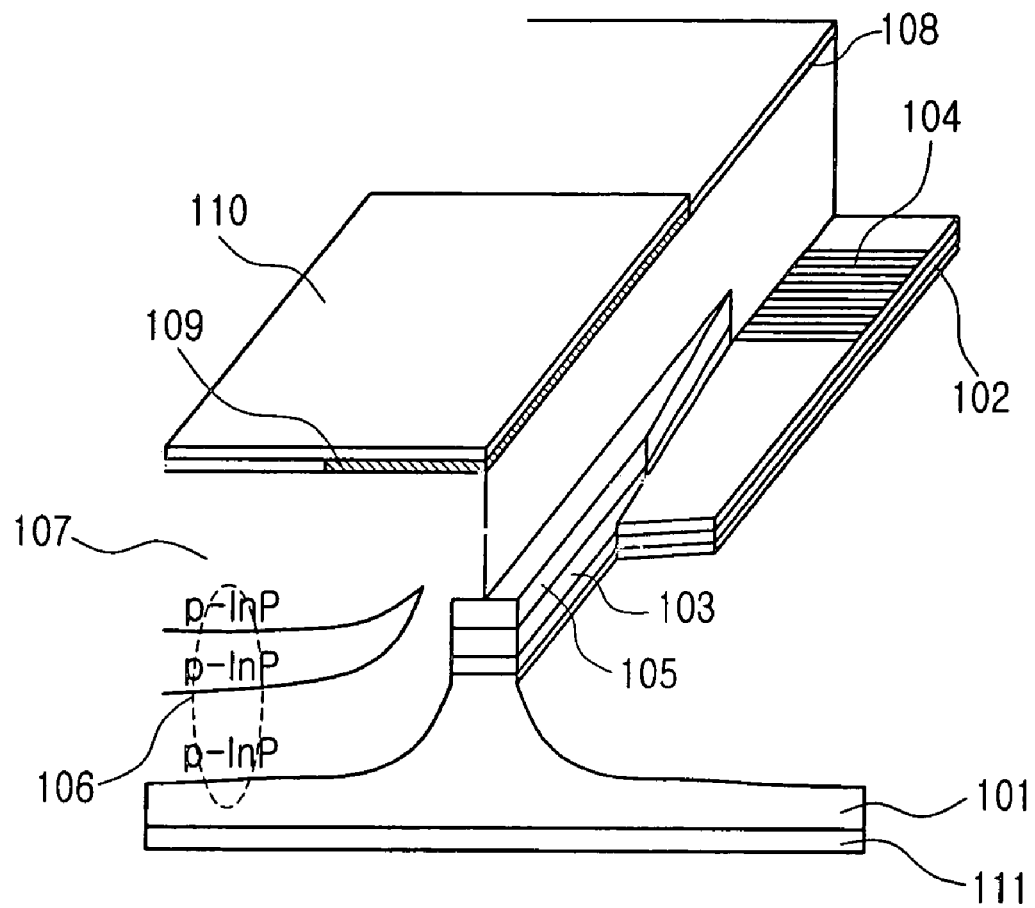
FIG. 1 is a prospective view showing a structure of a gain-clamped semiconductor optical amplifier according to the prior art.
Figure 2:
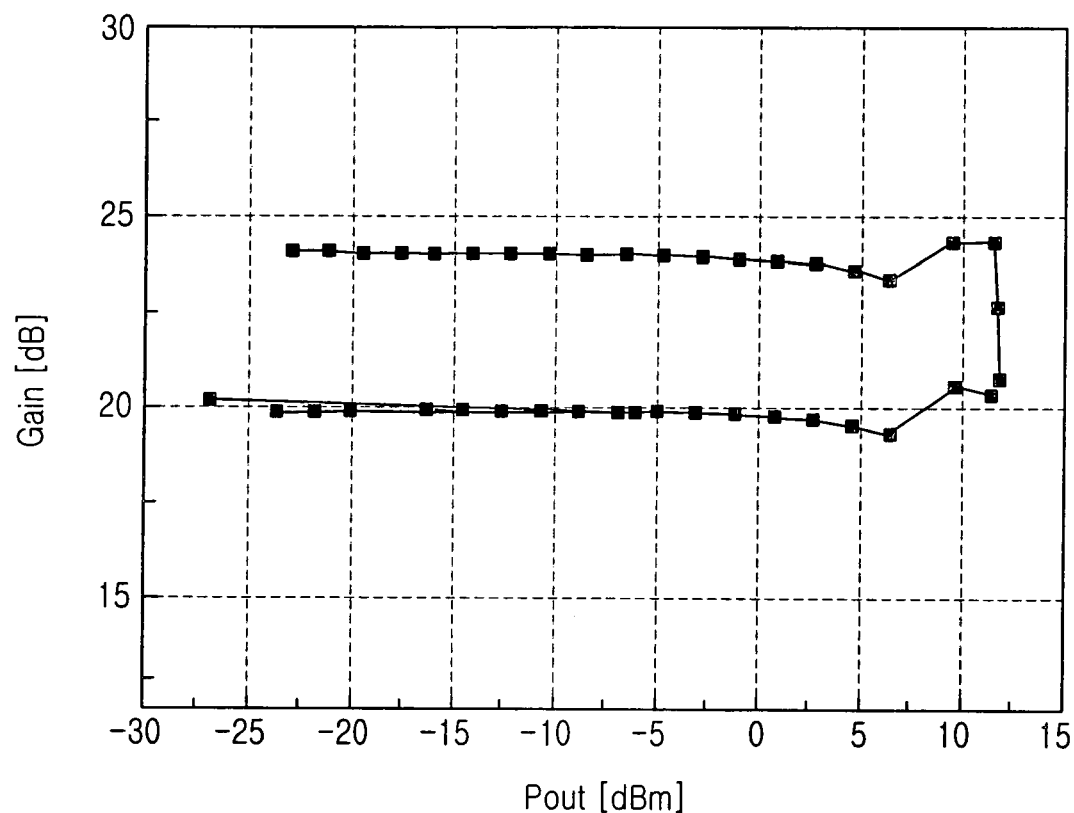
FIG. 2 is a graph showing a gain property of the gain-clamped semiconductor optical amplifier in FIG. 1.
Figure 5:
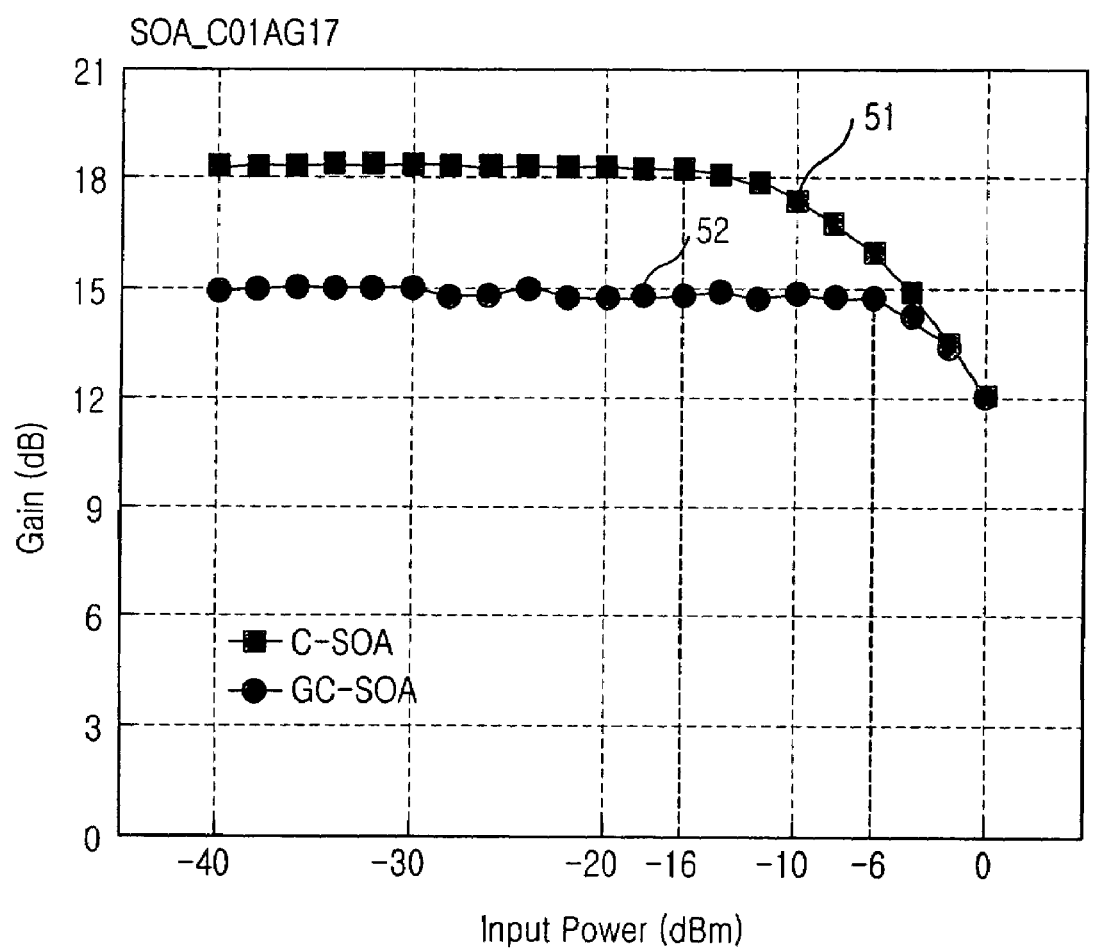
FIG. 5 is a graph showing gain property of a gain-clamped semiconductor optical amplifier according to the present invention.

FIG. 5 is a graph showing the gain property of the gain-clamped semiconductor optical amplifier according to the present invention. Referring to FIG. 5, when a semiconductor optical amplifier having a gain of 18 dB, for example, is used (graph line 51), the gain after passing through the wavelength selective reflector is reduced from 18 dB to 15 dB (graph line 52). This is caused by the reduction of the total gain of the device due to electric charge consumed by light reflected by the wavelength selective reflector. Further, the intensity of inputted light when the gain saturation starts to occur increases from −16 dB (graph line 51) to −6 dB (graph line 52). That is, when the gain is reduced without the gain clamping effect, the intensity of gain-saturated input light increases by the reduction of the gain. As described above, the present invention enables a sufficient gain clamping effect to be obtained. Furthermore, a gain change around gain saturation as shown in the conventional gain-clamped semiconductor optical amplifier in FIG. 1 does not occur in the present invention. This is because light needed for gain clamping employs light over a wide wavelength range instead of light of a single wavelength, so that there is no change in the total gain of the optical amplifier according to wavelength change.

Figure 6:
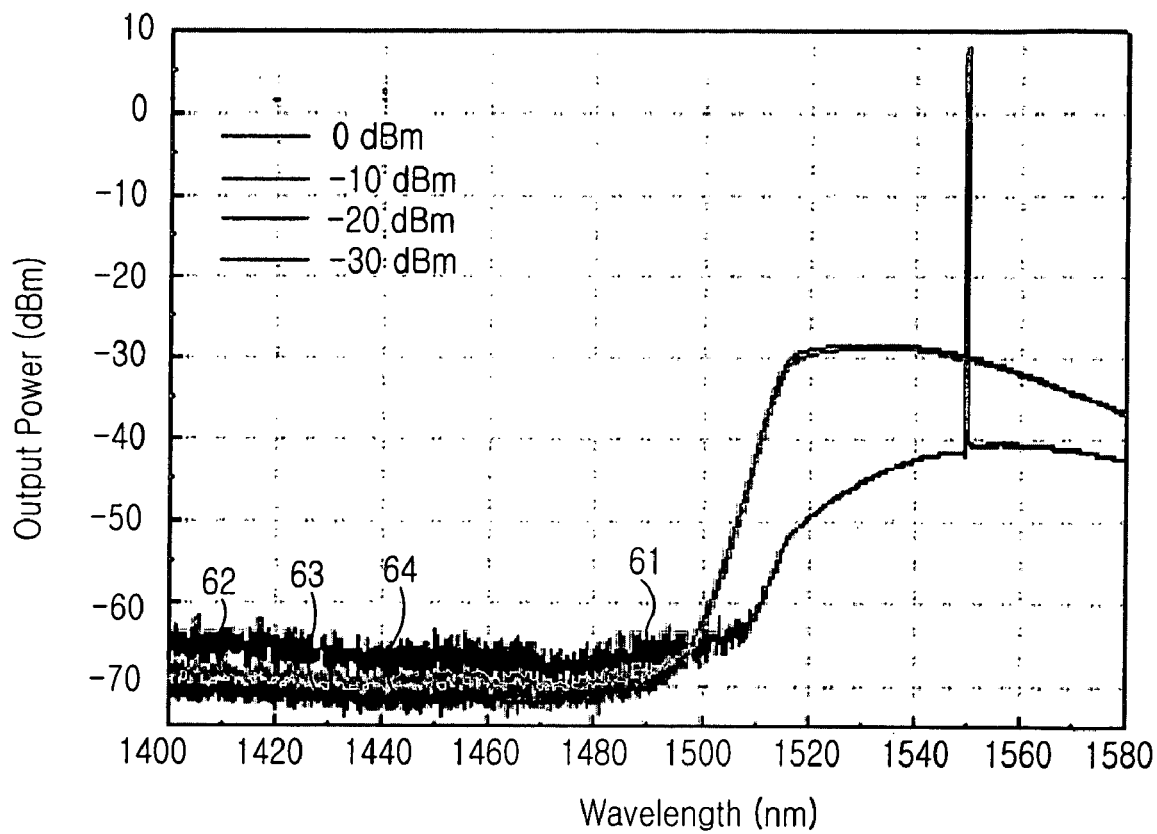
FIG. 6 is a graph showing spectrum of output light when the intensity of inputted light changes in a gain-clamped semiconductor optical amplifier according to the present invention.

FIG. 6 is a graph showing the spectrum of output light when the intensity of inputted light changes in a gain-clamped semiconductor optical amplifier according to the present invention. FIG. 6 shows the spectrum of output light when the power of the input light are 0 dB (graph line 61), −10 dB (graph line 62), −20 dB (graph line 63), and −30 dB (graph line 64). As shown, the intensity of the inputted light before gain saturation, i.e., the portion excepting the signal portion in the gain spectrum, shows no change. This is because the gain does not change within the gain spectrum before the intensity of the inputted light increases up to the intensity of gain-saturated light.

As described above, an effective gain-clamped semiconductor optical amplifier can be achieved using a wavelength selective reflector without employing a Bragg reflector laser oscillation structure or a separate single mode light source.

The gain-clamped semiconductor optical amplifier according to the present invention has a simple manufacturing process in comparison with a conventional device having a Bragg reflector, and has an advantage in that the gain does not change before gain saturation.

Furthermore, according to the present invention, the reflection factor of a wavelength selective reflector can be adjusted so that a clamped gain value of the semiconductor optical amplifier can also be easily adjusted.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A gain-clamped semiconductor optical amplifier comprising:
   a semiconductor optical amplifier for amplifying an inputted optical signal and outputting amplified spontaneous emission light, the amplified spontaneous emission light consisting of a first portion and a second portion, the first portion having a wavelength range to be amplified; and
   a wavelength selective reflector configured to pass the first portion of the amplified spontaneous emission light through and reflecting the second portion of the amplified spontaneous emission light to the semiconductor optical amplifier, the first and second portions having respective spectrum bands, said reflector being configured with a wavelength dividing point that divides the spectrum band of the first portion from the spectrum band of the second portion.

2. The gain-clamped semiconductor optical amplifier as claimed in claim 1, wherein a clamped gain value of the gain-clamped semiconductor optical amplifier is adjusted by adjusting a reflection factor of the wavelength selective reflector.

3. The gain-clamped semiconductor optical amplifier as claimed in claim 1, wherein the semiconductor optical amplifier comprises:
   a semiconductor substrate;
   an optical waveguide including a lower cladding, an active layer, and an upper cladding sequentially laminated on the semiconductor substrate;
   window regions, each of which is formed between one end of the optical waveguide and a cleavage surface opposed to said one end of the optical waveguide; and
   anti-reflection layers, formed on the cleavage surfaces.

4. The gain-clamped semiconductor optical amplifier as claimed in claim 1, wherein the wavelength selective reflector is positioned subsequent to the semiconductor optical amplifier.

5. The gain-clamped semiconductor optical amplifier as claimed in claim 1, wherein the wavelength selective reflector is positioned prior to the semiconductor optical amplifier.

6. The gain-clamped semiconductor optical amplifier as claimed in claim 1, wherein the wavelength selective reflector is a wavelength division multiplex filter.

7. The gain-clamped semiconductor optical amplifier as claimed in claim 1, wherein the wavelength selective reflector is external to the semiconductor optical amplifier.

8. The gain-clamped semiconductor optical amplifier as claimed in claim 1, wherein the wavelength selective reflector is integrated with the semiconductor optical amplifier.

9. The gain-clamped semiconductor optical amplifier of claim 1, the reflector being further configured for clamping the gain value by adjusting a reflection factor.

10. The gain-clamped semiconductor optical amplifier as claimed in claim 9, wherein the wavelength selective reflector is external to the semiconductor optical amplifier.

11. The gain-clamped semiconductor optical amplifier as claimed in claim 9, wherein the wavelength selective reflector is integrated with the semiconductor optical amplifier.

12. The gain-clamped semiconductor optical amplifier as claimed in claim 9, wherein the wavelength selective reflector is positioned subsequent to the semiconductor optical amplifier.

13. The gain-clamped semiconductor optical amplifier as claimed in claim 9, wherein the wavelength selective reflector is positioned prior to the semiconductor optical amplifier.

14. The gain-clamped semiconductor optical amplifier of claim 1, wherein light needed for gain clamping employs light over the spectrum band of said second portion.

15. A gain-clamped semiconductor optical amplifier comprising:
   a semiconductor optical amplifier; and
   a wavelength selective reflector, wherein the optical amplifier outputs amplified spontaneous emission light and the wavelength selective reflector passes a first portion of the amplified spontaneous emission light through and reflects a second portion of the amplified spontaneous emission light back to the semiconductor optical amplifier, said reflector being configured such that said second portion has a wide spectrum band rather than a wavelength of single mode.

16. The gain-clamped semiconductor optical amplifier as claimed in claim 15, wherein the wavelength selective reflector is positioned subsequent to the semiconductor optical amplifier.

17. The gain-clamped semiconductor optical amplifier as claimed in claim 15, wherein the wavelength selective reflector is positioned prior to the semiconductor optical amplifier.

18. The gain-clamped semiconductor optical amplifier as claimed in claim 15, wherein the wavelength selective reflector is a wavelength division multiplex filter.

19. The gain-clamped semiconductor optical amplifier as claimed in claim 15, wherein the wavelength selective reflector is integrated with the semiconductor optical amplifier.

20. The gain-clamped semiconductor optical amplifier as claimed in claim 15, wherein a clamped gain value is adjusted by adjusting a reflection factor of the wavelength selective reflector.

21. A gain-clamped semiconductor optical amplifier comprising:

a semiconductor optical amplifier; and a wavelength selective reflector, wherein the optical amplifier outputs amplified spontaneous emission light and the wavelength selective reflector passes a first portion of the amplified spontaneous emission light through and reflects a second portion of the amplified spontaneous emission light back to the semiconductor optical amplifier, wherein the wavelength selective reflector is external to the semiconductor optical amplifier.

* * * * *